(12) United States Patent
Bagger et al.

(10) Patent No.: US 7,515,006 B2
(45) Date of Patent: Apr. 7, 2009

(54) RESONATOR FOR A VOLTAGE CONTROLLED OSCILLATOR AND MANUFACTURING METHOD THEREOF

(75) Inventors: Reza Bagger, Järfalla (SE); Richard Wallace, Järfalla (SE); Tobias Hahn, Täby (SE); Dante Palima, Danderyd (SE)

(73) Assignee: Infineon Technologies AG, Munich (DE)

( * ) Notice: Subject to any disclaimer, the term of this patent is extended or adjusted under 35 U.S.C. 154(b) by 47 days.

(21) Appl. No.: 11/756,474

(22) Filed: May 31, 2007

(65) Prior Publication Data

US 2008/0036548 A1 Feb. 14, 2008

Related U.S. Application Data

(63) Continuation of application No. PCT/SE2005/001824, filed on Dec. 2, 2005.

(30) Foreign Application Priority Data

Dec. 3, 2004 (SE) .................................. 0402959

(51) Int. Cl.
  *H03B 5/12* (2006.01)
(52) U.S. Cl. .................... 331/117 D; 331/167; 331/181
(58) Field of Classification Search ............... 331/167, 331/117 D, 181
See application file for complete search history.

(56) References Cited

U.S. PATENT DOCUMENTS

| | | | |
|---|---|---|---|
| 3,319,187 A | * | 5/1967 | Crandall ............... 331/117 D |
| 3,614,665 A | * | 10/1971 | Weller et al. ............... 331/101 |
| 6,218,909 B1 | * | 4/2001 | Eban ..................... 331/117 R |
| 6,448,873 B1 | * | 9/2002 | Mostov ..................... 333/185 |
| 2005/0140487 A1 | * | 6/2005 | Sippola et al. ............... 336/200 |

FOREIGN PATENT DOCUMENTS

| | | |
|---|---|---|
| FR | 2568742 | 2/1986 |
| JP | 07312522 | 5/1994 |
| JP | 11068424 | 8/1997 |
| JP | 10215119 | 8/1998 |
| JP | 2000357921 | 6/1999 |

* cited by examiner

*Primary Examiner*—Joseph Chang
(74) *Attorney, Agent, or Firm*—Coats & Bennett, P.L.L.C.

(57) ABSTRACT

An LC resonator (117; 122) for a voltage controlled oscillator (13; 116) has an inductive transmission line 31; 51), and input and output ports (33a-b; 53a-b) connected to the transmission line, wherein the transmission line is grounded (G) in at least one end portion thereof. The inductive transmission line has a plurality of connection ports (P) that are capable of being connected to each other or to ground in order to tune the resonance frequency of the LC resonator from one frequency band to another. Further, a trimming capacitor (C) may be interconnected in the transmission line in order to further tune the resonance frequency of the LC resonator. Preferably, the LC resonator is formed as a microstrip or strip line structure in essentially a C or S shape on a laminate substrate (101-103).

18 Claims, 7 Drawing Sheets

RESONATOR FOR A VOLTAGE CONTROLLED OSCILLATOR AND MANUFACTURING METHOD THEREOF

CROSS-REFERENCE TO RELATED APPLICATION

This application is a continuation of co-pending International Application No. PCT/SE2005/001824 filed Dec. 2, 2005, which designates the United States, and claims priority to Swedish patent application number SE 0402959-1 filed Dec. 3, 2004, and is incorporated herein by reference in its entirety.

TECHNICAL FIELD

The present invention generally relates to the field of synthesizers, and more specifically the invention relates to a resonator for a voltage controlled oscillator (VCO).

BACKGROUND

There are various structures based on phase-locked loops (PLL) and direct synthesis that can be used in a base station environment to realize digital channel selection, synchronization and narrow-band filtering.

FIG. 1 is a schematic block diagram of a simple integer-N PPL synthesizer structure comprising error detector 11, loop filter 12, VCO 13 and divider 14 blocks. The VCO block 13 has an input 15a and an output 15b.

The VCO output 15b is divided by N in the divider block 14 and is fed back to the error detector block 11, which comprises a phase detector 16 and a charge pump 17. The error detector block has two-phase detection input ports, one for the feedback signal 18 from the VCO block and one for a fixed external reference signal 19 from a crystal oscillator. The error detector block compares the signals that are input.

The error signal is given by $$e(s)=F_{ref}-F_O/N,$$

where e(s) is error signal, $F_{ref}$ the fixed external reference signal, and $F_O/N$ is the VCO output signal divided by an integer N.

When e(s)=0, i.e. when the two signal input to the error detector block are equal in phase and frequency, the error will be zero and the loop is said to be in a locked condition, and $$F_O=N*F_{ref}$$

When e(s)≠0, i.e. when $F_O \neq N*F_{ref}$, the error detector block will drive the VCO.

The VCO is a voltage driven device and the charge pump of the error detector block is operating as a current source/sink device. The charge pump, the loop filter and the VCO form an integrator, which changes its output frequency in a direction of reducing the error signal e(s).

The VCO signal output frequency will be changed by $K_V*\Delta V$, where $K_V$ is the VCO sensitivity (in MHz/Volt) and $\Delta V$ is the change in VCO input voltage. The frequency adjustment procedure will be repeated until the error signal e(s) is zero, and the loop is locked.

FIG. 2 is a schematic circuit diagram of the VCO block 13 as being comprised in the synthesizer of FIG. 1. The VCO block 13 comprises an oscillator 21 and a mechanism 22 for frequency tuning, which may be achieved by tuning of a resonance frequency.

The oscillator comprises typically an active device, such as a bipolar transistor 23, and a resonator structure 24. For a LC network based resonator, the resonance occur at $f_0=1/(2\pi(LC)^{1/2})$. This means that for a fix inductance, the resonance frequency is tuned by tuning the capacitance. The mechanism for frequency tuning is thus typically realized by a varactor, such as a voltage controlled tunable capacitor or a FET voltage dependent capacitor.

The resonator structure is typically realized as an essentially L shaped microstrip inductor line connected to one or several capacitors. The circuit is formed on top of a ceramic substrate having a high dielectric constant.

SUMMARY

A drawback of a resonator structure of the above kind is that it is expensive. The ceramic substrate is obviously a cost-limiting factor. On the other hand, a resonator structure of the above kind realized on a laminate board with low dielectric constant and higher loss tangent would have too low Q factor and occupy too much space.

A further limitation of a conventional resonator structure is that it is not very flexible, e.g. it is typically not tunable.

During production, the traditional resonator has to be laser trimmed. A drawback of the laser trimming method is that several laser trimmers are required to avoid a production bottle neck. Additionally, the conventional resonator would have been too large to fit into the required area.

There exists a need to provide a resonator for a voltage controlled oscillator, which is formed on a laminate substrate, but still has high Q value and occupies small area on the substrate.

Furthermore, there exists a need to provide such a resonator, which is has excellent performance, is area efficient, reliable, of low cost, easy to implement, and easily trimable at production phase for tuning of the resonance frequency, e.g. to various frequency bands such as 800, 900, 1800, 1900 MHz GSM frequency bands.

There exists still a further need to provide a flexible method for manufacturing a resonator for a voltage controlled oscillator, which fulfills any of the above needs.

According to an embodiment, an LC resonator for a voltage controlled oscillator may comprise an inductive transmission line, and input and output ports connected to said transmission line, wherein said transmission line is grounded in at least one end portion thereof, and wherein said inductive transmission line comprises a plurality of connection ports that are capable of being connected to each other or to ground in order to tune the resonance frequency of said LC resonator to a selected frequency band.

The resonator according to various embodiments has superior flexibility and wide frequency range tuning capability realized in a fraction of space compared to conventional structures.

Further characteristics and advantages of the various embodiments will be evident from the detailed description of the embodiments given hereinafter and the accompanying FIGS. 1-10, which are given by way of illustration only, and are thus not limitative of the present invention.

DETAILED DESCRIPTION

Figure 1:
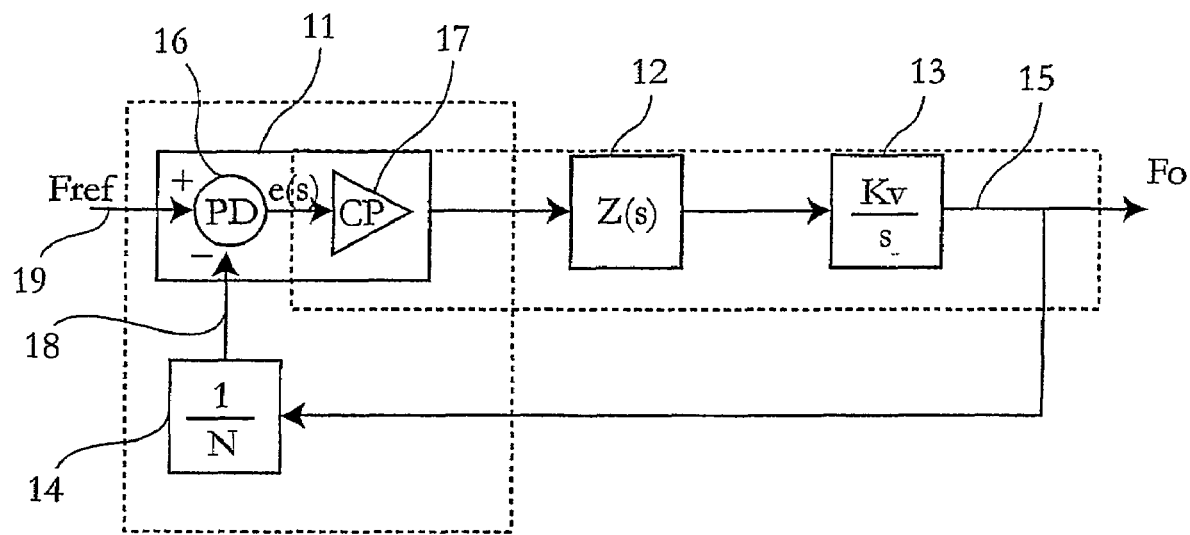
FIG. 1 is a schematic block diagram of a PPL synthesizer wherein an embodiment can be implemented.
Figure 2:
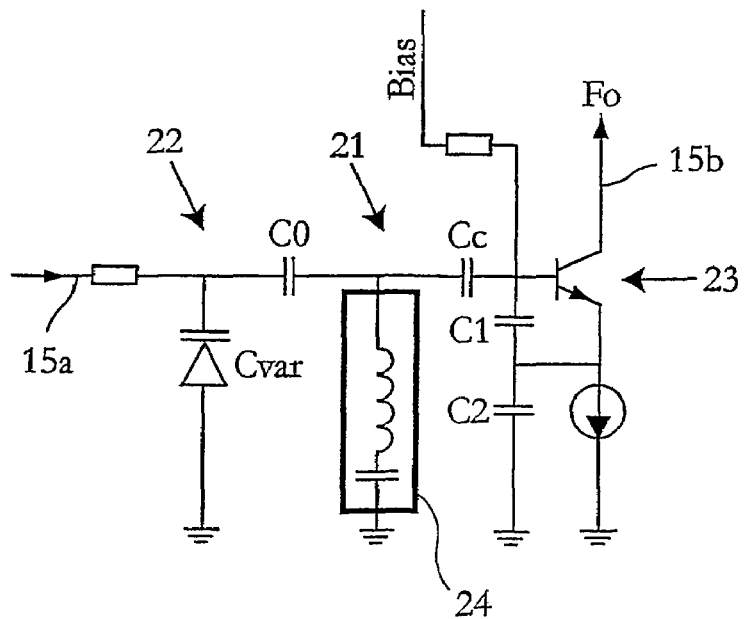
FIG. 2 is a schematic circuit diagram of a voltage controlled oscillator as being comprised in the synthesizer of FIG. 1.
Figure 3:
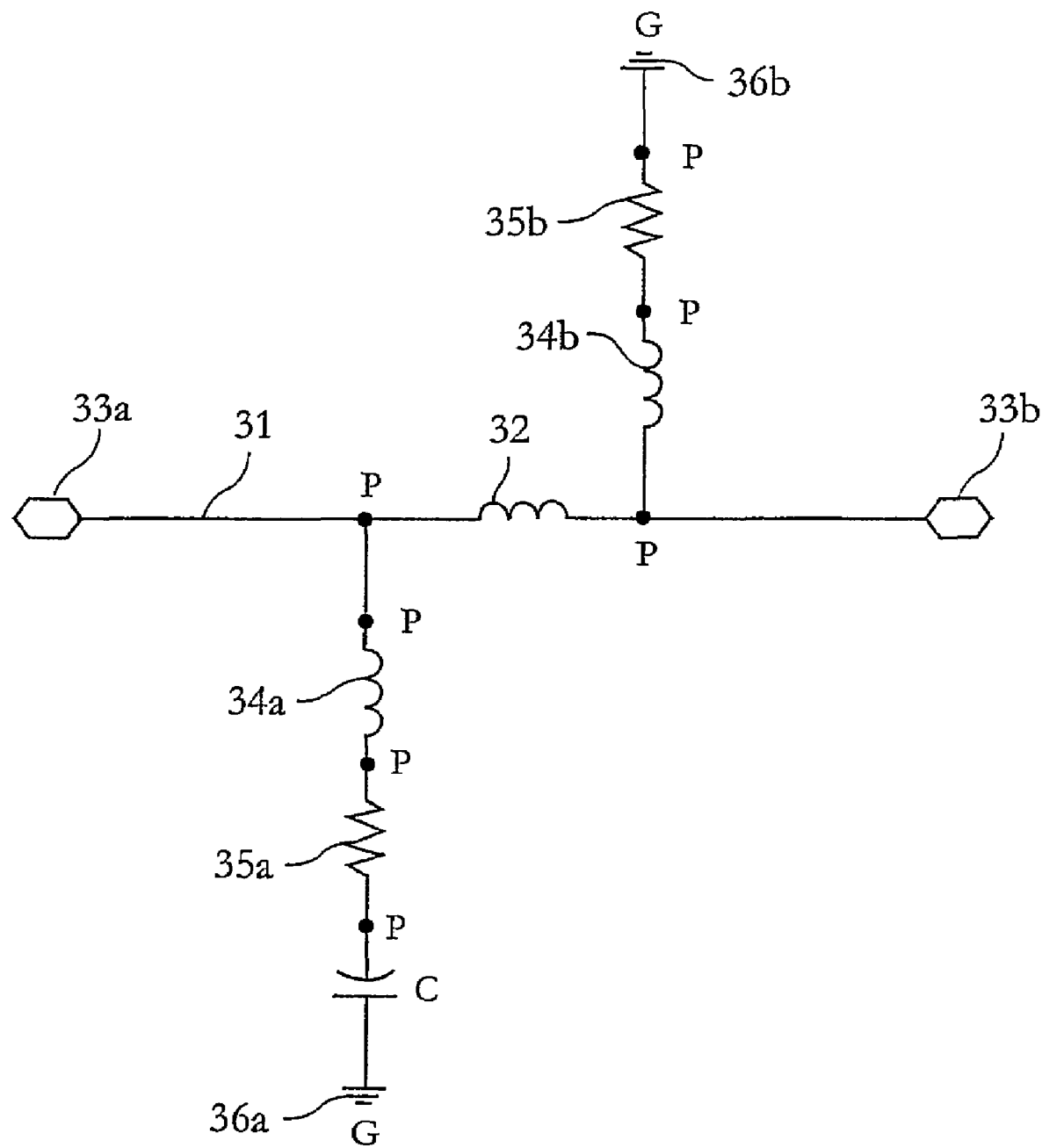
FIGS. 3 and 4 are each a schematic circuit diagram of a resonator according to a respective embodiment.

A first embodiment of an LC resonator structure for a voltage controlled oscillator according to an embodiment is shown in FIG. 3. The resonator structure is primarily, but not exclusively, intended for use in synthesizers for transmitters and receivers in GSM base stations applications.

The resonator structure includes a transmission line 31 optionally with a small inductor interconnected in a central part thereof. A respective input/output port 33a-b is connected to the transmission line on each side of the inductor. Each of the transmission line portions forms a transmission line inductance 34a-b and a parasitic resistance 35a-b, and is grounded in an outer end portion 36a-b.

A ground plane conductor may be arranged below the resonator structure.

According to an embodiment, the resonator structure comprises a plurality of ports P, which may be connected to each other or to ground in order to adapt the resonator structure for a given frequency band. Further, the transmission line comprises a trimming capacitor C for tuning the resonator structure to a desired frequency band.

By means of the ports connectable to each other or to ground and the trimming capacitor a great flexibility is achieved. Typically, for GSM the plurality of ports P are connected to obtain a 24 resonance frequency for either one of the frequency bands 800, 900, 1800, or 1900 MHz.

Figure 4:
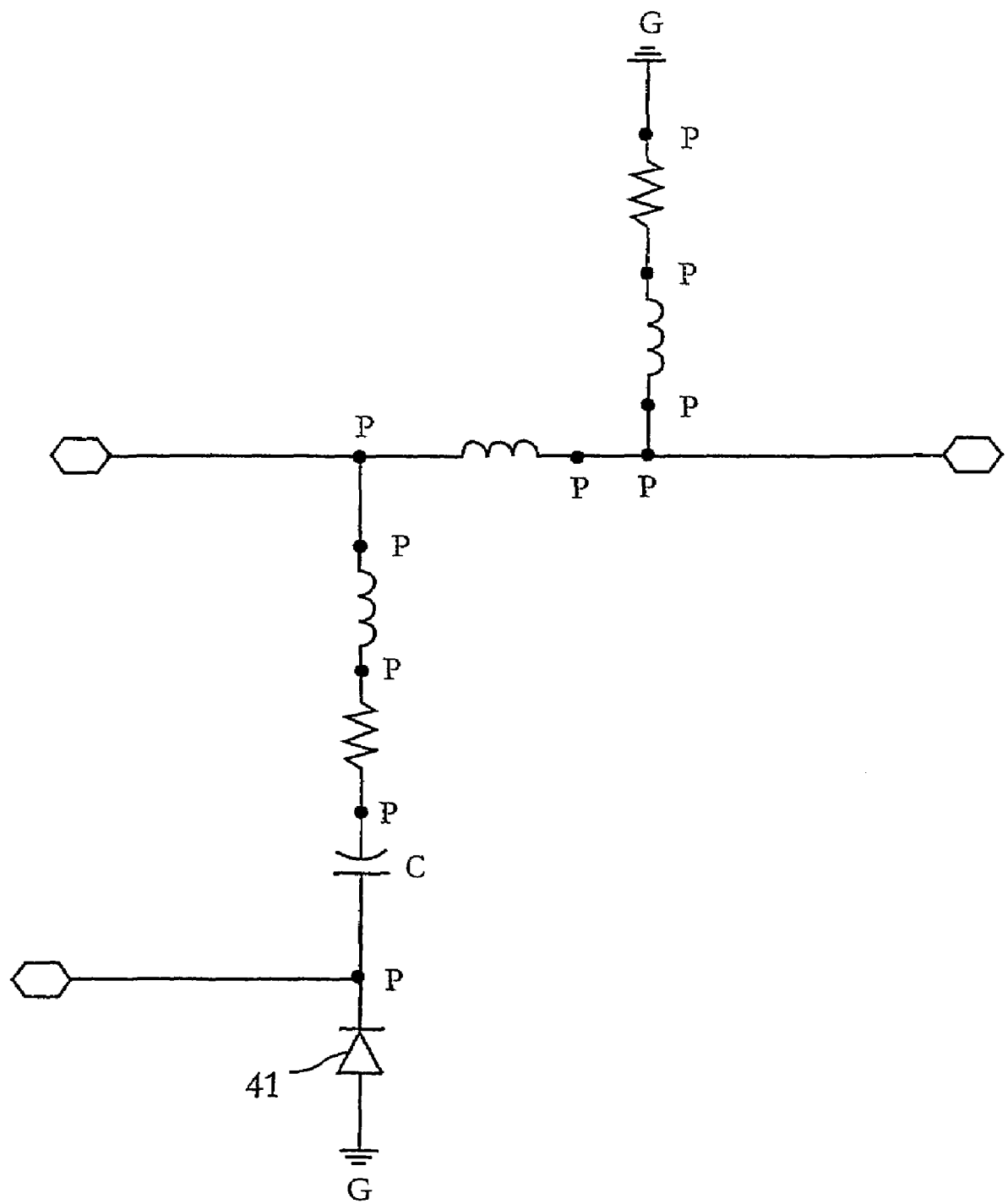

A second embodiment of a resonator structure for a voltage controlled oscillator according to an embodiment is shown in FIG. 4. This embodiment differs from the FIG. 3 embodiment in that a varactor 41 is interconnected in the transmission line between the trimming capacitor C and ground G. Further, an additional input/output port is connected to the transmission line between the trimming capacitor and the varactor.

The mentioned transmission line can be realized as a strip conductor, microstrip, embedded microstrip, or strip line conductor. Alternatively, the resonator structure is realized as a composite structure including both a microstrip and a strip line. The microstrip or strip line part can be trimmed separately to achieve more flexibility. Electrical tuning of the structure is also possible to get additional flexibility this through a varactor diode see schematic at FIG. 4.

FIGS. 5-9 are each a schematic layout realization of a resonator according to a respective embodiment.

Figure 5:
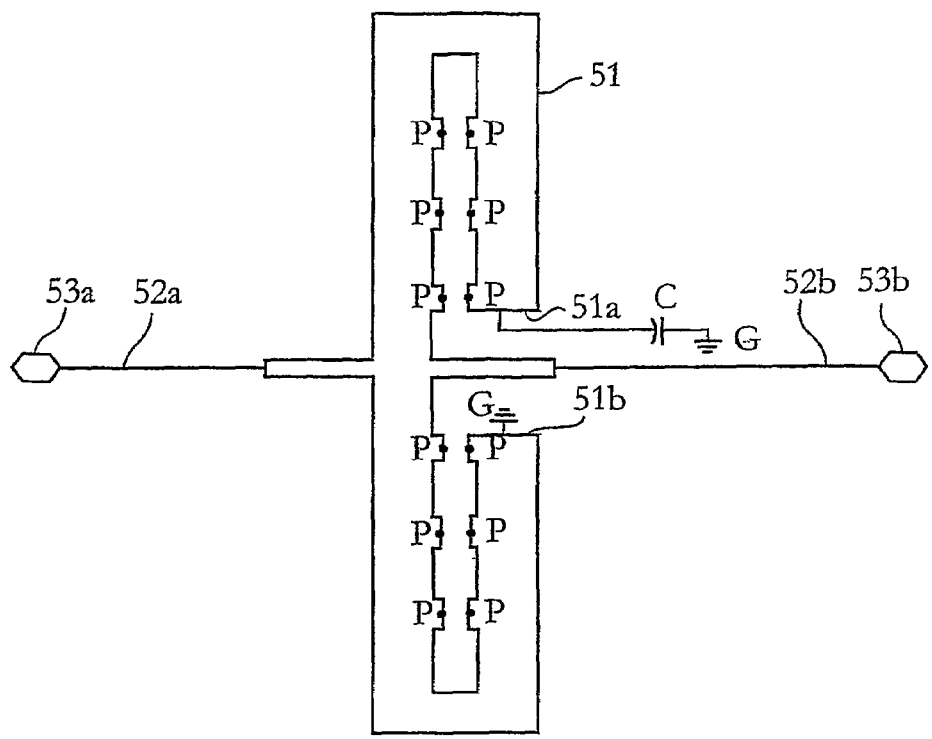
FIGS. 5-9 are each a schematic layout realization of a resonator according to a respective embodiment.

FIG. 5 shows a C-shaped microstrip or strip line conductor 51 having two microstrip conductors 52a-b to which input/output ports 53a-b are connected. The input/output ports 53a-b are connected at opposite sides of the microstrip or strip line conductor 51. The ends 51a-b of the transmission line 51 are grounded G, one of them via a trimming capacitor C. The C shape of the layout gives a compact and space saving structure. Twelve ports P are provided as an example of realization, each of which being connectable to ground and/or to some or all of the other ones of the ports. If the ports P connectable to each other, they may be preferably connectable to each other, two and two, so that oppositely located ports with respect to the inner portion of the C-shaped layout are connectable to each other.

Figure 6:
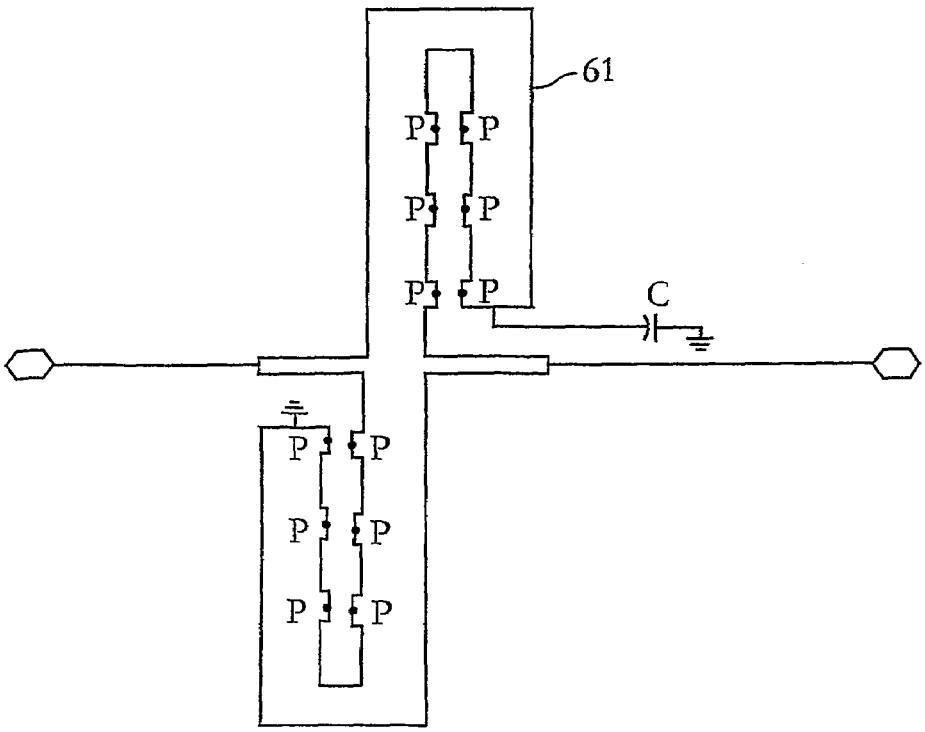

FIG. 6 shows a microstrip or strip line conductor 61 having an S-shaped layout. In other respects the FIG. 6 embodiment is similar to the FIG. 5 embodiment.

Figure 7:
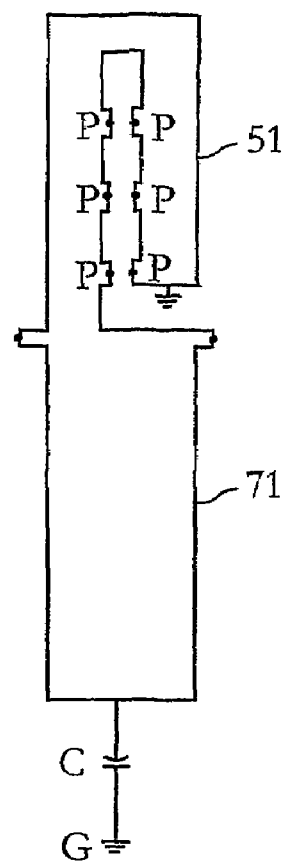

FIG. 7 shows a structure that differs from that of FIG. 5 in that half the microstrip or strip line conductor 51 is exchanged for a conductive patch 71. The end of the patch not connected to the microstrip or strip line 51 is connected to ground G via a trimming capacitor C.

Figure 8:
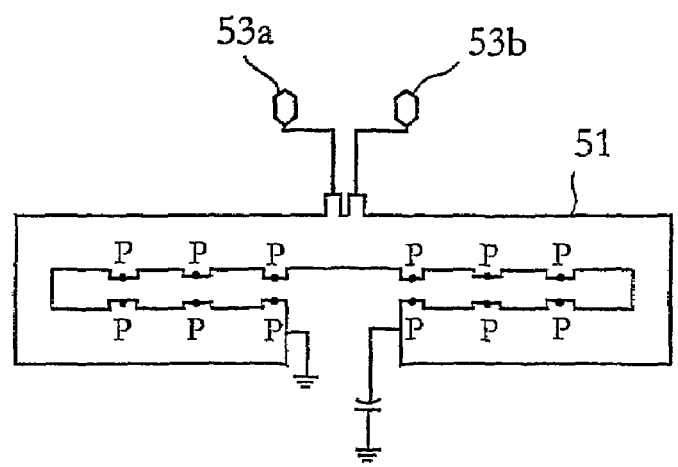

FIG. 8 shows a structure that differs from that of FIG. 5 in that the input/output ports 53a-b are connected at the same side of the microstrip or strip line conductor 51.

Figure 9:
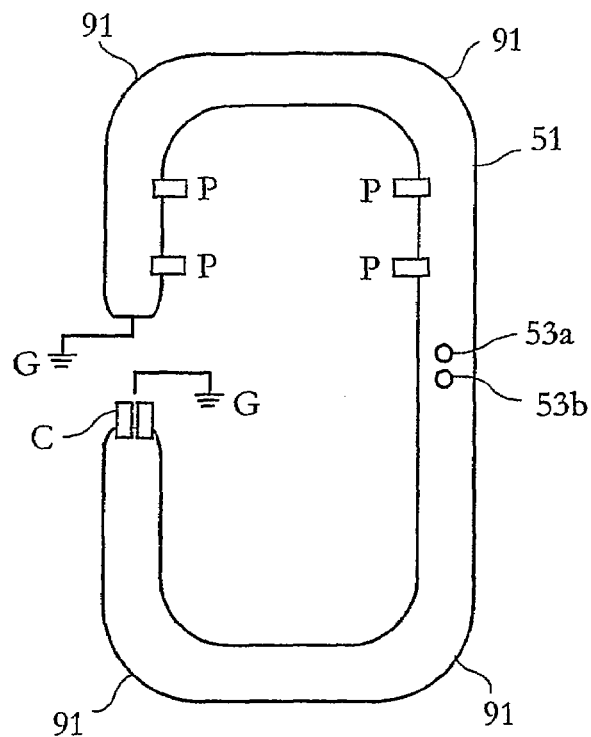

FIG. 9, finally, shows a structure that differs from that of FIG. 5 in that the microstrip or strip line conductor has rounded corners 91. Four ports P are indicated. For four band GSM application, the ports P as counted from the input/output ports may be grounded to obtain resonant structures for the 1900, 1800, 900, and 800 MHz bands, respectively.

It shall generally be appreciated that the structures illustrated in FIGS. 5-9 are merely examples. Other layouts are naturally possible, even if the layouts of FIGS. 5, 8, and 9 seem to be very compact in size.

It shall be pointed out that in some instances, preferably in obtaining resonance frequency for the higher frequency bands 1800 and 1900 MHz, the trimming capacitor may be dispensed with. In such instances the resonance frequency may be preferably tuned only by connecting the plurality of ports P to each other or to ground.

Figure 10:
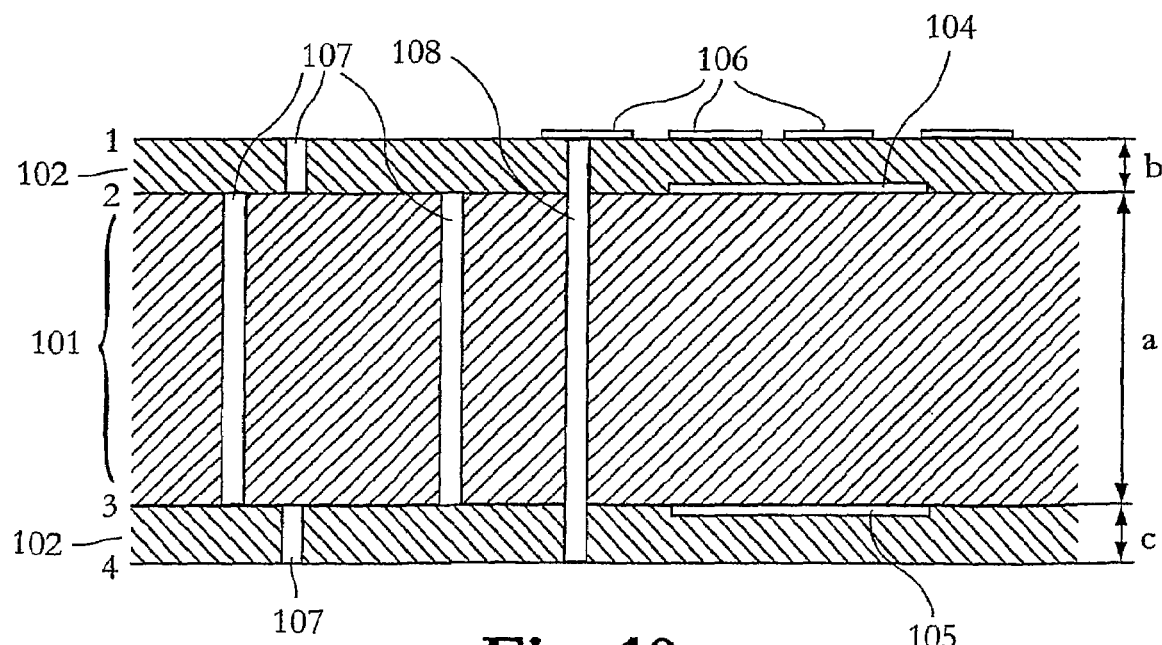
FIG. 10 is a schematic cross sectional view of a portion of a low cost substrate wherein a voltage controlled oscillator according to an embodiment can be implemented.

FIG. 10 is a schematic cross sectional view of a portion of a low cost substrate on which a voltage controlled oscillator according to an embodiment can be implemented.

In conventional synthesizers a high quality substrate of ceramics is used. Laminate based substrates or boards were found to not provide resonators of sufficiently high quality and/or of sufficiently small size because of low dielectric constant of the substrate.

However, by using the above described resonator, a synthesizer having a high quality resonator may be formed on a laminate substrate of a particular design, still in a miniaturized configuration.

Thus, the laminate shown in FIG. 10 comprises a core layer 101 having a thickness a, an upper layer 102 having a thickness b, and a bottom layer 103 having a thickness c. Preferably, the thickness of the core layer is at least 600 μm, or at least 7 times larger than the thickness b of the top layer. In a non-limiting example embodiment the thicknesses are: a=1500 μm, b=150 μm, and c=150 μm.

The core layer may be a laminate from Rogers Corporation having e.g. a dielectric constant of between 3 and 4 such as e.g. about 3.4, and having low surface roughness.

The tree layers define four component layers, numbered from top to bottom 1, 2, 3, and 4. A resonator structure 104 is formed in layer 2, and a ground plane conductor 105 is formed in layer 3, or alternatively in layer 4. Other components 106 are preferably mounted on layer 1. Electrical connections between the different layers are provided in forms of electrical vias 107, 108 between layers 1 and 2, 2 and 3, and 3 and 4, respectively. Some vias may naturally pass through some or all of the layers. For instance, in FIG. 10 one via 108 is shown as extending from layer 1 to layer 4.

Further characteristics of the laminate substrate include:
- Dissipation factor Df≦0.02.
- Solder mask opening directly over resonator structure.
- Robustness. Resonator structure in layer 2 gives a structure that is robust in production.
- Contamination risks are eliminated or reduced.
- Electrical performance of the resonator structure can be altered by using RLC components.
- The resonator concept according to an embodiment may be extended to other applications and frequency bands than those of GSM.

All components do not have to be assembled.

The resonator concept may be applied on any multi-layer board.

It shall be appreciated that a resonator structure like that of FIG. 9 measuring 3 mm times 6 mm with 1 mm wide embedded microstrip, and that is formed in a laminate substrate such as being described with reference to FIG. 10 may have a Q factor of about 40-50 for 800-900 MHz GSM frequencies.

Thus, a resonator circuit realized through an LC network of the above described kind is capable of reducing phase noise at synthesizer level of design by means of the feasible high quality factor.

The size of the resonator structure depends on the substrate parameters as dielectric constant and thickness of the substrate. The resonator structure according to an embodiment is realized on a substrate with low dielectric constant. Yet high Q value is provided simultaneously as the structure occupies very small area on the substrate.

Further, the resonator structure according to an embodiment is easily tunable for different frequency bands up to far above 1 GHz.

Manufacturing of a synthesizer module may be performed as follows.

Laminate boards or substrates, also referred to as carriers, as being disclosed with reference to FIG. 10, are pre-fabricated mounted with resonator structures, and electrical connections, conductors and isolators. Such module blanks may later be used for a number of different applications.

Then, in production IC circuits, various devices and components needed for the synthesizer operation are mounted on top of the laminate substrate, i.e. in layer 1 as described with reference to FIG. 10. Also, the ports P and the tunable capacitors of the resonator structure (e.g. any of the structures disclosed in FIGS. 3-9) according to an embodiment are connected and tuned, respectively, to achieve a suitable resonance frequency.

To this end, the ports and capacitors are accessed through openings made in the uppermost laminate layer (i.e. the laminate layer of thickness b as illustrated in FIG. 10) and aligned with the ports and capacitors. The ports may be realized as connection pads that can be connected by means of soldering components such as resistors to the pads from above. The trimming capacitors may be connected in a similar manner.

In such manner, the resonator structure is tailored in a simple and straightforward manner during production for use in a particular frequency band. The overall manufacturing process is simplified and made more efficient.

Figure 11:
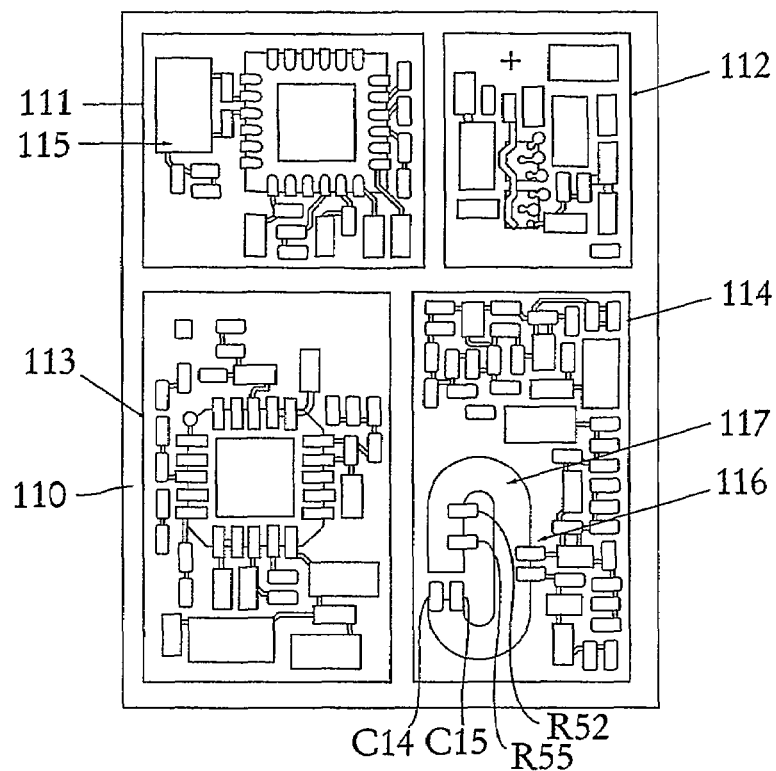
FIGS. 11 and 12 are each a module layout for a synthesizer according to a respective embodiment.
Figure 12:
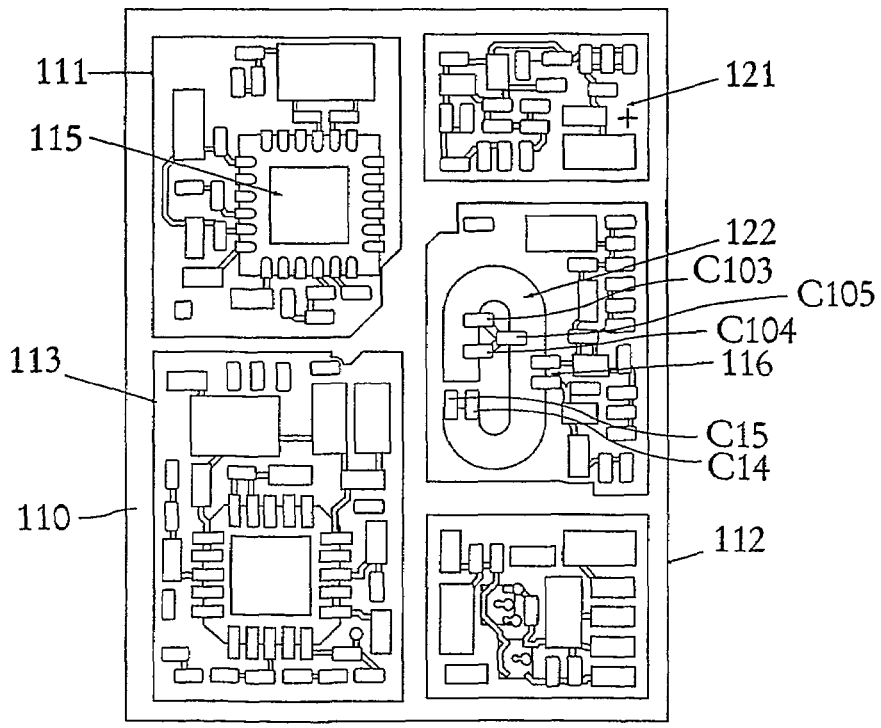

FIGS. 11 and 12 are each a module layout for a PLL based synthesizer for use in e.g. GSM base station applications according to a respective embodiment.

The FIG. 11 layout comprises four blocks: a balun/switch block 111, a regulator block 112, a PLL block 113 and a VCO/buffer block 114. Each of the blocks is separated from the other by electrically conductive vias 110. The vias 110 operate as Faraday cages to provide an efficient electromagnetic shielding of each of the blocks.

Particularly, the PLL block 113, the switch 115 of the balun/switch block 111, and the VCO 116 of the VCO/buffer block 114 have to be efficiently shielded from each other.

The C shaped resonator 117 within the VCO/buffer block 114 has two connection ports or pads R52 and R55 and two trimming capacitors C14 and C15 accessible from above. This particular synthesizer substrate module is mounted with a resonator 117 that can be tuned to either 800 or 900 MHz GSM frequency bands (transmitting or receiving frequencies). During production, the various components of the synthesizer are mounted and connections are made. The resonator is tuned to the 900 MHz frequency band by connecting both the connection pads R52 and R55 to ground, preferably via respective resistors. Similarly, the 800 MHz frequency band is reached by connecting only the connection pad R55 to ground. The trimming capacitors C14 and C15 are connected or left disconnected in order to fine tune the resonance frequency of the resonator.

The FIG. 12 layout comprises five blocks. Here, the VCO 116 and the buffer 121 of VCO/buffer block 114 are located in different blocks. The resonator has three connection ports or pads C103, C104 and C105 and two trimming capacitors C14 and C15 accessible from above. This synthesizer substrate module is mounted with a resonator 122 that can be tuned to either one of the 800, 900, 1800, or 1900 MHz GSM frequency bands. The resonator is tuned to the 1800-1900 MHz frequency band by connecting all the connection pads C103, C104 and C105 to ground. Resonance in the 900 MHz frequency band is achieved by connecting the connection pads C103 and C104 to ground, and resonance in the 800 MHz frequency band is achieved by connecting only the connection pad C104 to ground.

It shall be appreciated that the particular layouts shown in FIGS. 11 and 12 are merely examples. The resonator, particularly, may be tunable into other frequency bands and used in other application such as 3G, Bluetooth and WLAN applications, for instance.

The invention claimed is:

1. An LC resonator for a voltage controlled oscillator comprising:
    an inductive transmission line having end portions and side portions, and
    input and output ports connected to at least one of the side portions of said transmission line, wherein
    said transmission line is grounded in at least one of the end portions, and wherein
    said inductive transmission line comprises a plurality of connection ports that are capable of being connected to each other or to ground in order to tune the resonance frequency of said LC resonator to a selected frequency band.

2. The LC resonator according to claim 1, wherein
    a capacitor is interconnected in said transmission line, and
    said capacitor is a trimming capacitor in order to tune the resonance frequency of said LC resonator.

3. The LC resonator according to claim 1, wherein said transmission line is realized as a strip conductor on a substrate above a ground plane conductor.

4. The LC resonator according to claim 1, wherein said transmission line has essentially the shape of a C or an S.

5. The LC resonator according to claim 1, wherein said transmission line is formed on a laminate substrate, preferably on an upper surface of a thick core layer, which has low surface roughness, and a ground plane conductor is provided directly below the transmission line on a lower surface of said core.

6. The LC resonator according to claim 5, wherein said laminate substrate includes at least one layer on each side of said transmission line.

7. The LC resonator according to claim 1, wherein the input and output ports are connected to the same side portion of the transmission line.

8. An LC resonator for a voltage controlled oscillator comprising:
    an inductive transmission line having end portions and side portions, the inductive transmission line being grounded in at least one of the end portions and formed on a laminate substrate comprising a thick core and thin laminate layers on each side of the core, and said inductive transmission line being provided between the core and one of the thin laminate layers,
    input and output ports connected to at least one of the side portions of said transmission line, a ground plane conductor wherein at least said core separates said inductive transmission line and said ground plane conductor, and wherein said core is at least 600 pm thick, or is at least seven times thicker than said one of the thin laminate layers.

9. The LC resonator according to claim 8, wherein said transmission line is formed on a surface of said thick core, which has low surface roughness.

10. The LC resonator according to claim 8, wherein said inductive transmission line comprises a plurality of connection ports that are capable of being connected to each other or to ground in order to tune the resonance frequency of said LC resonator to a selected frequency band, and said inductive transmission line comprises a trimming capacitor in order to tune the resonance frequency of said LC resonator.

11. The LC resonator according to claim 10, wherein said transmission line is realized as a microstrip, embedded microstrip, strip line, or strip conductor on a substrate.

12. The LC resonator according to claim 10, wherein said transmission line has essentially the shape of a C or an S.

13. The LC resonator according to claim 8, wherein the input and output ports are connected to the same side portion of the transmission line.

14. A method for manufacturing an LC resonator for a voltage controlled oscillator, preferably a voltage controlled oscillator comprised in a synthesizer block, comprising the steps of:

providing an inductive transmission line having end portions and side portions, providing input and output ports connected to at least one of the side portions of said transmission line, wherein said transmission line is grounded in at least one of the end portions, and providing said inductive transmission line with a plurality of connection ports that are capable of being connected to each other or to ground in order to tune the resonance frequency of said LC resonator to a selected frequency band.

15. The method according to claim 14, comprising the steps of:

providing a capacitor interconnected in said transmission line, and providing said capacitor with a trimming capability in order to tune the resonance frequency of said LC resonator to thereby provide a pre-fabricated LC resonator.

16. The method according to claim 15, wherein a frequency band for operation of said LC resonator is selected, said connection ports are connected to tune the resonance frequency of said LC resonator to said selected frequency band, and said capacitor is tuned to the selected frequency band to thereby produce a particular LC resonator for the selected frequency band.

17. The method according to claim 14, wherein the LC resonator is formed within a laminate substrate.

18. The method according to claim 14, comprising providing the input and output ports connected to the same side portion of the transmission line.

* * * * *